(12) United States Patent
Nakano

(10) Patent No.: US 10,367,278 B2
(45) Date of Patent: Jul. 30, 2019

(54) FLEXIBLE WIRING PLATE, FLEXIBLE WIRING PLATE PAIR, AND DISPLAY DEVICE

(71) Applicant: JOLED INC., Tokyo (JP)

(72) Inventor: Yutaka Nakano, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/988,653

(22) Filed: May 24, 2018

(65) Prior Publication Data

US 2018/0375235 A1 Dec. 27, 2018

(30) Foreign Application Priority Data

Jun. 27, 2017 (JP) ................................. 2017-125663

(51) Int. Cl.
| | | |
|---|---|---|
| *H01R 12/00* | (2006.01) | |
| *G02F 1/13* | (2006.01) | |
| *G02F 1/15* | (2019.01) | |
| *G02F 1/1333* | (2006.01) | |
| *H01R 12/62* | (2011.01) | |
| *H01R 12/61* | (2011.01) | |
| *H05K 1/14* | (2006.01) | |
| *H05K 3/36* | (2006.01) | |

(52) U.S. Cl.
CPC .......... *H01R 12/62* (2013.01); *H01R 12/613* (2013.01); *H05K 1/142* (2013.01); *H05K 1/147* (2013.01); *H05K 3/361* (2013.01); *H05K 2201/049* (2013.01); *H05K 2201/052* (2013.01); *H05K 2201/058* (2013.01); *H05K 2201/10128* (2013.01)

(58) Field of Classification Search
CPC ... H01R 12/00; G02F 1/13; G02F 1/15; G02F 1/1333
USPC ........ 361/749; 345/84, 87; 349/58; 359/265; 439/67, 74
See application file for complete search history.

(56) References Cited

U.S. PATENT DOCUMENTS

| | | | | |
|---|---|---|---|---|
| 5,841,414 | A * | 11/1998 | Tanaka ................. | G02F 1/13452 345/87 |
| 6,392,872 | B1 * | 5/2002 | Doustou, III ............. | G06F 1/18 174/541 |
| 6,715,110 | B1 * | 3/2004 | Beebe ................. | G06F 11/2268 714/39 |
| 6,769,922 | B1 * | 8/2004 | Lee ..................... | G02F 1/13452 439/74 |
| 7,479,940 | B2 * | 1/2009 | Marhefka ............. | G02F 1/1345 345/84 |
| 2002/0036745 | A1 * | 3/2002 | Kim .................... | G02F 1/13452 349/149 |
| 2002/0041155 | A1 * | 4/2002 | Asami ...................... | H01J 11/12 313/583 |
| 2002/0057235 | A1 * | 5/2002 | Murai ................. | G02F 1/13452 345/84 |

(Continued)

FOREIGN PATENT DOCUMENTS

JP 2002-329941 11/2002

*Primary Examiner* — Xiaoliang Chen
(74) *Attorney, Agent, or Firm* — Greenblum & Bernstein, P.L.C.

(57) ABSTRACT

A first wiring plate is a flexible wiring plate to be directly connected to a display panel, and includes a first connector. The first connector is directly connected to a second connector included in a second wiring plate to be directly connected to the display panel.

12 Claims, 11 Drawing Sheets

(56) References Cited

U.S. PATENT DOCUMENTS

| | | | | |
|---|---|---|---|---|
| 2003/0002003 | A1* | 1/2003 | Kuwaharada | G02F 1/13452 |
| | | | | 349/149 |
| 2003/0031001 | A1* | 2/2003 | Chu | G02F 1/13452 |
| | | | | 361/784 |
| 2004/0066473 | A1* | 4/2004 | Fukuwaki | G02F 1/133308 |
| | | | | 349/58 |
| 2004/0106306 | A1* | 6/2004 | Miyamura | H01R 12/62 |
| | | | | 439/67 |
| 2005/0233611 | A1* | 10/2005 | Sung | G02F 1/13452 |
| | | | | 439/67 |
| 2006/0001820 | A1* | 1/2006 | Cheng | G02F 1/13452 |
| | | | | 349/150 |
| 2006/0119761 | A1* | 6/2006 | Okuda | G02F 1/13452 |
| | | | | 349/58 |
| 2006/0132425 | A1* | 6/2006 | Kim | G02F 1/13452 |
| | | | | 345/104 |
| 2006/0176254 | A1* | 8/2006 | Lee | G02F 1/13452 |
| | | | | 345/87 |
| 2006/0199443 | A1* | 9/2006 | Lo | G02F 1/13452 |
| | | | | 439/835 |
| 2006/0230659 | A1* | 10/2006 | Hu | G09F 13/22 |
| | | | | 40/544 |
| 2007/0019275 | A1* | 1/2007 | Okuda | G02F 1/133615 |
| | | | | 359/265 |
| 2007/0126721 | A1* | 6/2007 | Kurokawa | G06F 3/1431 |
| | | | | 345/204 |

* cited by examiner

FLEXIBLE WIRING PLATE, FLEXIBLE WIRING PLATE PAIR, AND DISPLAY DEVICE

CROSS REFERENCE TO RELATED APPLICATIONS

The present application is based on and claims priority of Japanese Patent Application No. 2017-125663 filed on Jun. 27, 2017. The entire disclosure of the above-identified application, including the specification, drawings and claims is incorporated herein by reference in its entirety.

FIELD

The present disclosure relates to flexible wiring plates, flexible wiring plate pairs, and display devices including the flexible wiring plate pairs.

BACKGROUND

A conventional display panel using organic electroluminescence (EL) is connected through a flexible substrate (flexible wiring plate) to a print substrate which feeds power supply or signals to the drive circuit of the display panel. For example, Patent Literature 1 discloses formation of an alignment mark having a predetermined shape (such as an elliptical shape) in a flexible wiring plate to prevent positional deviation in the rotational direction when the flexible wiring plate is connected to a display panel.

CITATION LIST

Patent Literature

Patent Literature 1: Japanese Unexamined Patent Application Publication No. 2002-329941

SUMMARY

Technical Problem

As in a multi-layered flexible wiring plate, for example, such a multi-layered structure of the flexible wiring plate may lead to difficulties in manufacturing large-sized flexible wiring plates. For this reason, such a large-sized display panel is manufactured using a plurality of flexible wiring plates. In this case, adjacent flexible wiring plates may be electrically connected to each other through an additional connection wiring plate different from the flexible wiring plates. Specifically, one of the adjacent flexible wiring plates is connected to an additional connection wiring plate through a connector, and the other flexible wiring plate is connected to the connection wiring plate through a different connector.

In other words, the connection of the flexible wiring plates connected to the display panel requires a connection wiring plate and two pairs of connectors, leading to an increase in cost.

The present disclosure has been made in consideration of the problem. An object of the present disclosure is to provide a flexible wiring plate which can be connected to a different flexible wiring plate to be connected to a display panel while preventing an increase in cost, a flexible wiring plate pair, and a display device.

Solution to Problem

To solve the problem, the flexible wiring plate according to one aspect of the present disclosure is a flexible wiring plate to be connected to a display panel. The flexible wiring plate includes a first connector, and the first connector is directly connected to a second connector included in a different flexible wiring plate to be connected to the display panel.

To achieve the object, the flexible wiring plate pair according to one aspect of the present disclosure includes the flexible wiring plate described above, and the different flexible wiring plate.

To achieve the object, the display device according to one aspect of the present disclosure includes a display panel, and the flexible wiring plate pair described above.

Advantageous Effects

The present disclosure can provide a flexible wiring plate which can be connected to a different flexible wiring plate to be connected to a display panel while preventing an increase in cost, a flexible wiring plate pair, and a display device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
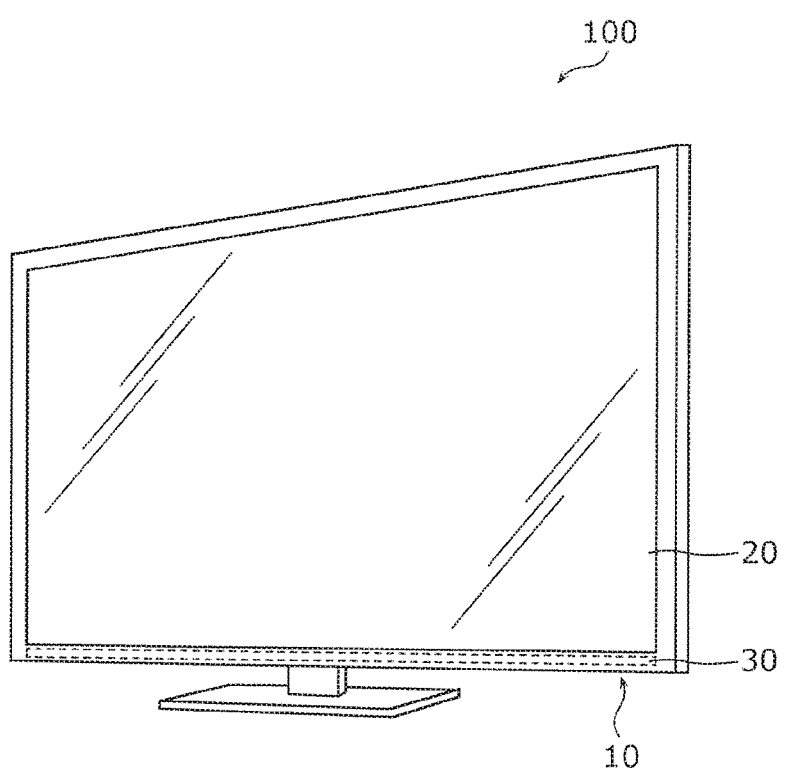
FIG. 1 is a perspective view illustrating one example of a display device including a display module according to Embodiment 1.
Figure 1:
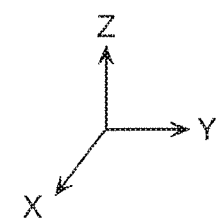

Embodiments of the present disclosure will now be described with reference to the drawings. The embodiments described below all illustrate specific examples of the present disclosure. Accordingly, numeral values, shapes, materials, components, arrangements, positions, and connection forms of the components, steps, order of the steps, and the like shown in the embodiments below are only examples, and will not limit the present disclosure. Among the components of the embodiments below, the components not described in an independent claim representing the most superordinate concept of the present disclosure are described as arbitrary components.

The drawings are schematic views, and are not always strictly illustrated. In the drawings, identical reference numerals are given to substantially the same configurations, and the duplication of description thereof will be omitted or simplified.

In this specification, the terms "substantially" and "about" mean that production errors and dimensional tolerance are included.

Embodiment 1

[1-1. Configuration of Display Module]

A configuration of a display module according to the present embodiment will be described with reference to FIGS. 1 and 2.

FIG. 1 is a perspective view illustrating one example of a display device 100 including a display module 10 according to the present embodiment. FIG. 2 is a schematic view illustrating a configuration of the display module 10 according to the present embodiment. Specifically, (a) of FIG. 2 illustrates a state when the display module 10 is seen from the plus side of the X-axis to the minus side of the X-axis (hereinafter, also referred to as "in a plan view"). (b) of FIG. 2 illustrates a state where the display module 10 is seen from the minus side of the Z-axis to the plus side of the Z-axis (hereinafter, also referred to as "in a lateral view"). For simplification, in (a) and (b) of FIG. 2, the display module 10 is illustrated on a different scale from that of the display module 10 illustrated in FIG. 1. The same also applies to the drawings below.

As illustrated in FIG. 1, the display device 100 including the display module 10 according to the present embodiment is, for example, a thin-profile display apparatus for television which displays images. The display device 100 can display any image. The image may be a moving picture, or may be a still picture. The image may include characters and/or numerals.

Figure 2:
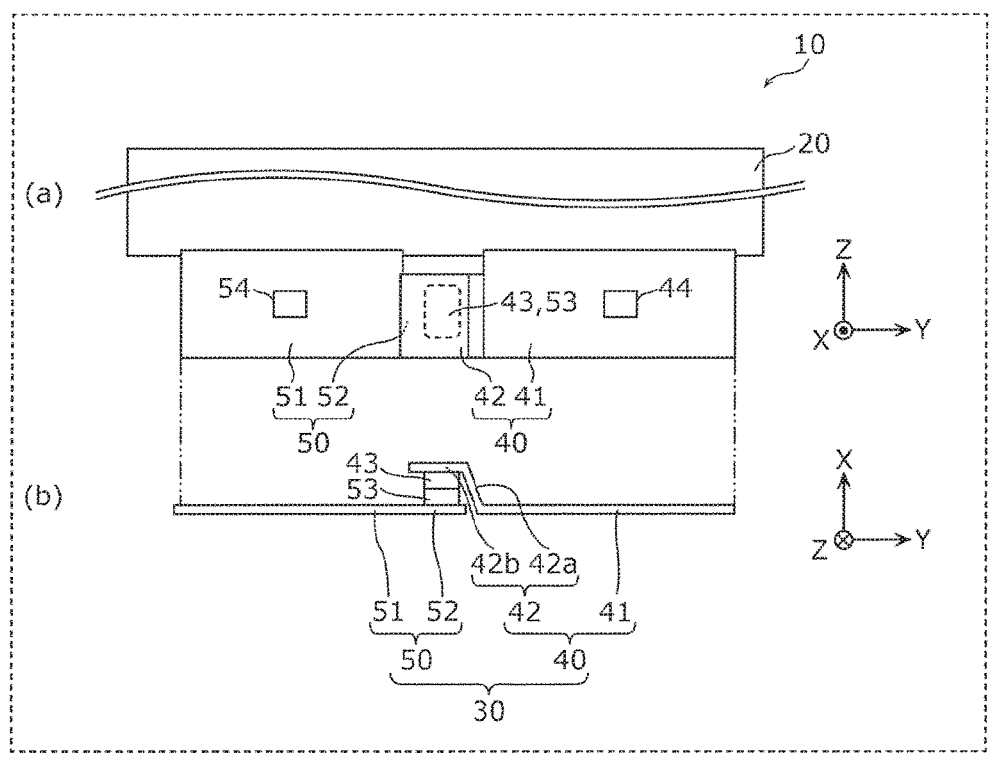
FIG. 2 is a schematic view illustrating a configuration of the display module according to Embodiment 1.

As illustrated in FIG. 2, the display module 10 includes a display panel 20 and a flexible wiring plate pair 30. Hereinafter, the flexible wiring plate pair 30 is also simply referred to as wiring plate pair 30. The flexible wiring plate is also simply referred to as wiring plate.

The components included in the display module 10 will now be described with reference to the drawings when necessary.

[1-1-1. Display Panel]

The display panel 20 will be described with reference to FIG. 2.

The display panel 20 displays images. The display panel 20 is implemented with an organic EL panel or a liquid crystal panel, for example. In the case where the display panel 20 is a liquid crystal panel, the display module 10 may include a light source having a plurality of light emitting diodes (LEDs).

Although not illustrated, a source driver and a gate driver may be packaged in the display panel 20. In other words, the display panel 20 may be a Chip-On-Glass (COG) packaged display panel.

The display panel 20 can have any size, and is about 20 Inches as one example. The display panel 20 can include any substrate. The substrate may be a glass substrate, or may be a plastic substrate. The substrate may have flexibility.

[1-1-2. Wiring Plate Pair]

The wiring plate pair 30 will be described with reference to FIG. 2.

As illustrated in (a) and (b) of FIG. 2, the wiring plate pair 30 is a flexible substrate which electrically connects the display panel 20 to an external circuit (not illustrated), and includes a first wiring plate 40 and a second wiring plate 50. For example, the first wiring plate 40 and the second wiring plate 50 are disposed to be aligned at the same end of the display panel 20 (the end on the minus side of the Z-axis in (a) of FIG. 2), and are connected to each other. In a plan view, the first wiring plate 40 and the second wiring plate 50 are elongated wiring plates. The ends of the wiring plates in the direction intersecting substantially perpendicular to the longitudinal direction thereof (the Z-axis direction; hereinafter, also referred to as the transverse direction or lateral direction) are connected to the display panel 20.

The first wiring plate 40 includes a first body 41, and a first arm 42 projected from the first body 41 in the longitudinal direction (Y-axis direction) of the first wiring plate 40.

The first body 41 is a wiring portion which electrically connects the display panel 20 to an external circuit and electrically connects the second wiring plate 50 to an external circuit. The first body 41 has a wiring pattern for this electrical connection. In a plan view, the first body 41 has an elongated shape, as one example, a rectangular shape. The first body 41 includes a connection terminal (not illustrated) for connection to the display panel 20 at one end in the direction intersecting substantially perpendicular to the longitudinal direction of the first body 41 (the end on the plus side of the Z-axis). The term "end" includes an end of the first body 41 or the second body 51 (described later) and its peripheral portion in a plan view.

On the first body 41, an electronic component 44 such as an IC chip may be mounted, which processes signals for displaying images. In the following drawings, the electronic component 44 mounted on the first body 41 will be not illustrated.

The first arm 42 is a wiring portion which electrically connects the second wiring plate 50 to an external circuit through the first body 41. The first arm 42 has a wiring pattern for this electrical connection. The first arm 42 is projected from the edge of one end of the first body 41 in the longitudinal direction (the edge of the end on the plus side of the Z-axis) such that the first wiring plate 40 is connected to the second wiring plate 50. In the present embodiment, the first arm 42 extends, in a shape of a narrow elongation, from the first wiring plate 40 toward the second wiring plate 50. The edge of the other end of the first body 41 (the edge of the end of on the minus side of the Z-axis) does not have an arm for electrically connecting the second wiring plate 50 to an external circuit. The term "shape of a narrow elongation" indicates that the first arm 42 is disposed to extend with a width (length in the direction intersecting substantially perpendicular to the extending direction of the first arm 42) smaller than the width of the edge of the one end of the first body 41 (the length of the lateral direction of the first body 41). In other words, the first arm 42 is projected from part of the one end of the first body 41 in the longitudinal direction. In short, the first arm 42 has a width smaller than that of the first body 41.

As illustrated in (b) of FIG. 2, a first connector 43 connected to a second connector 53 is mounted on the first arm 42. In the present embodiment, the first connector 43 is mounted on the surface of the first arm 42 on the minus side of the X-axis.

The second wiring plate 50 includes a second body 51, and a second arm 52 projected from the second body 51 in the longitudinal direction (the Y-axis direction) of the second wiring plate 50.

The second body 51 is a wiring portion which electrically connects the display panel 20 to an external circuit through the first wiring plate 40. The second body 51 has a wiring pattern for this electrical connection. In a plan view, the second body 51 has an elongated shape, as one example, a rectangular shape. The second body 51 includes a connection terminal (not illustrated) for connection to the display panel 20 at one end of the second body 51 in the direction intersecting substantially perpendicular to the longitudinal direction (the end on the plus side of the Z-axis).

On the second body 51, an electronic component 54 such as an IC chip may be mounted, which processes signals for displaying images. In the following drawings, the electronic component 54 mounted on the second body 51 will not be illustrated.

The second arm 52 is a wiring portion which electrically connects the second body 51 to an external circuit through the first arm 42. The second arm 52 has a wiring pattern for this electrical connection. The second arm 52 is projected from part of the edge of one end of the second body 51 in the longitudinal direction (the edge of one end on the plus side of the Z-axis) such that the first wiring plate 40 is connected to the second wiring plate 50. In the present embodiment, the second arm 52 extends, in a shape of a narrow elongation, from the second wiring plate 50 toward the first wiring plate 40. The other end of the second body 51 (the edge of the end on the minus side of the Z-axis) does not have an arm for electrically connecting the second body 51 to an external circuit through the first wiring plate 40. The second arm 52 has a width smaller than that of the second body 51.

As illustrated in (b) of FIG. 2, a second connector 53 to be connected to the first connector 43 is mounted on the second arm 52. In the present embodiment, the second connector 53 is mounted on the surface of the second arm 52 on the plus side of the X-axis. In other words, the surface of the first arm 42 including the first connector 43 faces the surface of the second arm 52 including the second connector 53.

The second connector 53 is a counterpart of the first connector 43. For example, when the first connector 43 is a female connector, the second connector 53 is a male connector. By coupling such a first connector 43 to such a second connector 53, the first wiring plate 40 is directly connected to the second wiring plate 50 through the first connector 43 and the second connector 53 to form the wiring plate pair 30. In other words, the first wiring plate 40 and the second wiring plate 50 form a pair of wiring plates. The term "directly connected" indicates that the first wiring plate 40 is electrically and mechanically connected to the second wiring plate 50 without any additional connection wiring plate. The additional connection wiring plate is a wiring plate which electrically connects the first wiring plate 40 to the second wiring plate 50. The connection wiring plate may be a rigid substrate or a flexible substrate, or may be a cable. The additional connection wiring plate is a wiring plate not mechanically connected to the display panel 20.

When the first wiring plate 40 is connected to the second wiring plate 50 through an additional connection wiring plate, the first wiring plate 40 does not need to have the first arm 42, and the second wiring plate 50 does not need to have the second arm 52. In other words, the first arm 42 and the second arm 52 are disposed for direct connection of the first wiring plate 40 to the second wiring plate 50. When the first wiring plate 40 and the second wiring plate 50 are disposed in the display panel 20, in a plan view, the first arm 42 and the second arm 52 do not overlay the display panel 20. In other words, the first arm 42 and the second arm 52 do not have a connection terminal for connecting to the display panel 20.

The first arm 42 is formed in the first wiring plate 40 and the second arm 52 is formed in the second wiring plate 50 such that the first arm 42 overlaps with at least part of the second arm 52 in a plan view when the first wiring plate 40 and the second wiring plate 50 are disposed in the display panel 20. The first connector 43 may be disposed closer to the second body 51 than the second connector 53 in a plan view when the first wiring plate 40 and the second wiring plate 50 are disposed in the display panel 20. In other words, the first arm 42 may have a redundancy to an extent such that the first connector 43 is disposed closer to the second body 51 than the second connector 53 in a plan view. The term "the first wiring plate 40 and the second wiring plate 50 are disposed in the display panel 20" indicates that the first wiring plate 40 and the second wiring plate 50 are disposed in the positions where the first wiring plate 40 and the second wiring plate 50 are press bonded to the display panel 20. In the present embodiment, the first wiring plate 40 and the second wiring plate 50 are disposed at the end of the display panel 20 on the minus side of the Z-axis.

The first wiring plate 40 and the second wiring plate 50 are formed of a substrate layer made of a resin material and an electroconductive layer made of an electroconductive material such as metal, although these layers are not illustrated. The substrate layer is formed of an insulation film of polyimide having flexibility, for example. The electroconductive layer is formed of a metal foil, a laminate of metal foils, or a metal foil having a surface covered with solder, for example. The metal foil and the wiring are formed of Cu or Ag, for example.

The first wiring plate 40 is one example of the flexible wiring plate, and the second wiring plate 50 is one example of a different flexible wiring plate. An example of the display module 10 including the two wiring plates, i.e., the first wiring plate 40 and the second wiring plate 50, has been described above. The display module 10 can include two or more wiring plates without limitation.

[1-2. Process of Manufacturing Display Device]

The process of manufacturing a display device 100 according to the present embodiment will now be described with reference to FIGS. 3 to 4C.

Figure 3:
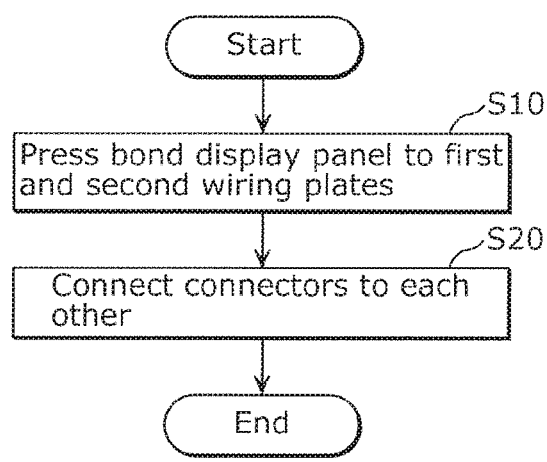
FIG. 3 is a flowchart illustrating a process of manufacturing the display module according to Embodiment 1.

FIG. 3 is a flowchart illustrating the process of manufacturing a display device 100 according to the present embodiment. Specifically, FIG. 3 is a flowchart illustrating the process of manufacturing the display module 10 included in the display device 100. Although the details will be described later, FIGS. 4A to 4C are schematic views illustrating the flow of manufacturing the display module 10 according to the present embodiment.

As illustrated in FIG. 3, a step of press bonding the display panel 20 to the first wiring plate 40 and the second wiring plate 50 is first performed (S10). In the press bonding step, using an adhesive having conductivity, such as an anisotropic conductive film (ACF), the display panel 20 is press bonded to the first wiring plate 40, and the display panel 20 is press bonded to the second wiring plate 50.

Here, the steps in Step S10 will be described with reference to FIGS. 4A and 4B.

Figure 4A:
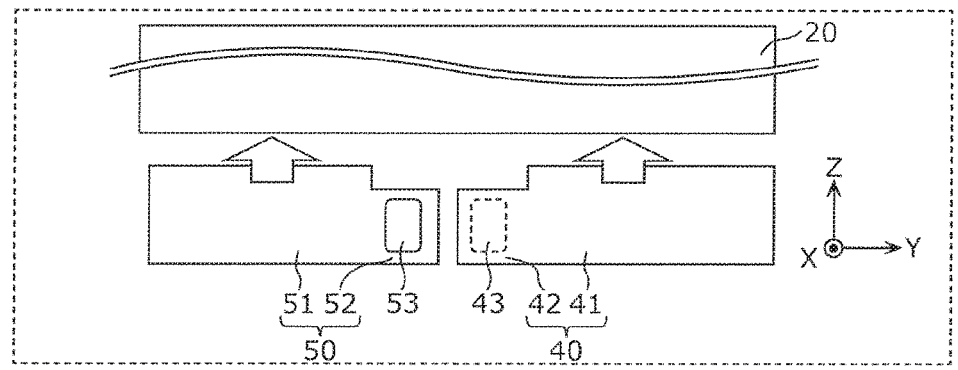
FIG. 4A is a schematic view illustrating a state before wiring plates according to Embodiment 1 are press bonded to a display panel.
Figure 4B:
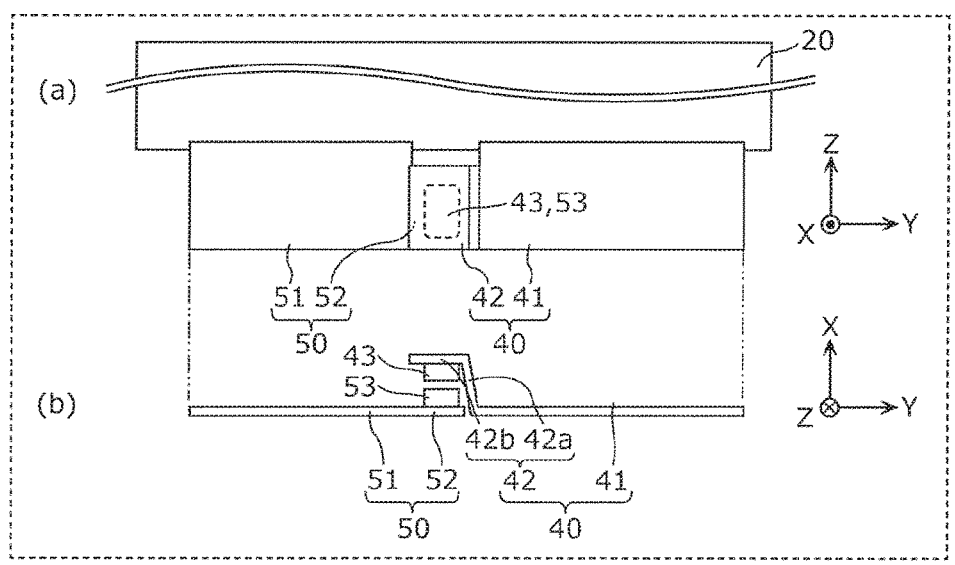
FIG. 4B is a diagram illustrating a state after the wiring plates according to Embodiment 1 are press bonded to the display panel.

FIG. 4A is a diagram illustrating a state before the first wiring plate 40 and the second wiring plate 50 according to the present embodiment are press bonded to the display panel 20.

As illustrated in FIG. 4A, the first wiring plate 40 and the second wiring plate 50 are prepared, in which the first arm 42 is formed from the edge of the end facing the edge of one end of the second body 51 among the edges of the ends of the first body 41, and the second arm 52 is formed from the edge of the one end facing the edge of the end of the first body 41 among the edges of the ends of the second body 51. In the next step, the first wiring plate 40 including the first connector 43 on the surface of the first arm 42 on the minus side of the X-axis and the second wiring plate 50 including the second connector 53 on the surface of the second arm 52 on the plus side of the X-axis are aligned on the minus side of the Z-axis of the display panel 20 (see the arrows in the drawing).

Although FIG. 4A illustrates an example in which the first wiring plate 40 and the second wiring plate 50 including the first arm 42 and the second arm 52 having an identical shape are prepared, any other configuration can be used. In this specification, the term "identical" includes not only cases where items completely coincide with each other, but also cases where items are substantially equal. For example, two numeric values having an error of several percent may be considered identical.

FIG. 4B is a diagram illustrating a state after the first wiring plate 40 and the second wiring plate 50 according to the present embodiment are press bonded to the display panel 20. Specifically, (a) of FIG. 4B illustrates the display panel 20, the first wiring plate 40, and the second wiring plate 50 in a plan view after press bonding. (b) of FIG. 4B illustrates the first wiring plate 40 and the second wiring plate 50 in a lateral view after press bonding.

In a plan view, the first arm 42 overlaps with at least part of the second arm 52 in the state where the display panel 20 is press bonded to the first wiring plate 40 and the second wiring plate 50. (a) of FIG. 4B illustrates an example in which in a plan view, the first arm 42 overlaps with the second arm 52 (for example, the first arm 42 covers the second arm 52).

As illustrated in (b) of FIG. 4B, in a lateral view, the first body 41 and the second body 51 are disposed on the same plane. In the present embodiment, in a plan view, the first body 41, the second body 51, and the second arm 52 are disposed on the same plane.

Again with reference to FIG. 3, a step of connecting the first connector 43 disposed in the first arm 42 to the second connector 53 disposed in the second arm 52 is subsequently performed (S20). In Step S20, the first connector 43 is coupled to the second connector 53. Thereby, the first wiring plate 40 is electrically and mechanically connected to the second wiring plate 50 through the first connector 43 and the second connector 53.

The steps in Step S20 will now be described with reference to FIG. 4C.

Figure 4C:
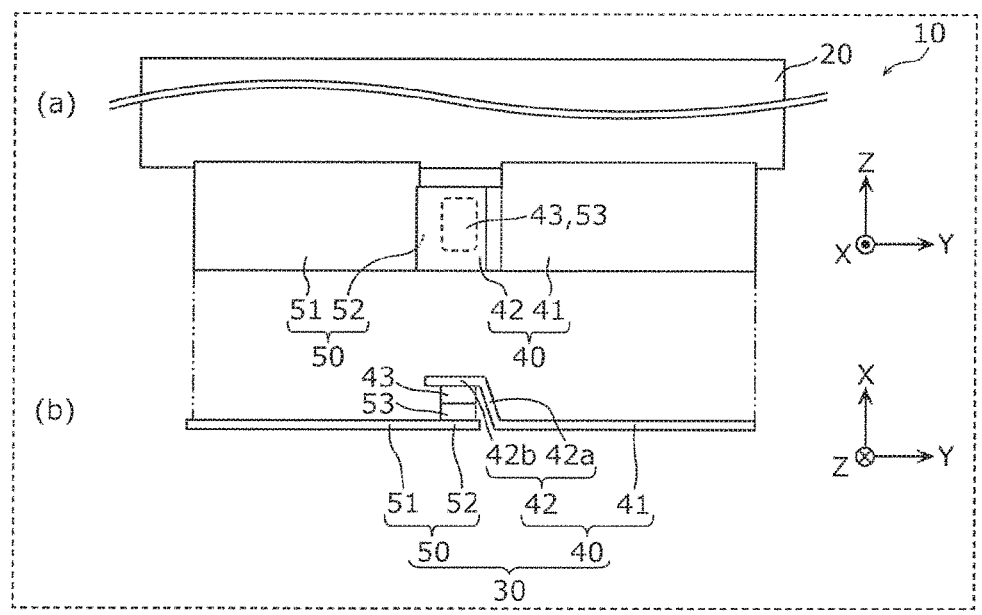
FIG. 4C is a schematic view illustrating a state after the wiring plates according to Embodiment 1 are connected to each other.

FIG. 4C is a schematic view illustrating a state after the first wiring plate 40 and the second wiring plate 50 according to the present embodiment are directly connected to each other. Specifically, (a) of FIG. 4C illustrates the display panel 20, the first wiring plate 40, and the second wiring plate 50 in a plan view after the first wiring plate 40 and the second wiring plate 50 are directly connected to each other. (b) of FIG. 4C illustrates the first wiring plate 40 and the second wiring plate 50 in a lateral view after the first wiring plate 40 and the second wiring plate 50 are directly connected to each other.

As illustrated in (a) and (b) of FIG. 4C, the first connector 43 is directly connected to the second connector 53 in Step S20. In other words, the first wiring plate 40 is connected to the second wiring plate 50 without any additional connection wiring plate. The first wiring plate 40 according to the present embodiment can be directly connected to the second wiring plate 50 with a simple configuration including the first arm 42. As a result, the display module 10 including the first wiring plate 40 and the second wiring plate 50 directly connected to each other is obtained.

As illustrated in (b) of FIG. 4C, the first arm 42 includes a first protrusion 42a projected from the first body 41 and a second protrusion 42b on which the first connector 43 is mounted. The first protrusion 42a has a redundancy for connecting the first connector 43 to the second connector 53. Such a first arm 42 having the first protrusion 42a enables the positional adjustment of the first connector 43 in a plan view through the adjustment of the first protrusion 42a when a deviation occurs in the press bonding position of the first wiring plate 40 or second wiring plate 50 to the display panel 20, for example.

In contrast, in the case where the first arm 42 does not have a first protrusion 42a and press bonding is performed in the state where the first wiring plate 40 is shifted to the plus side of the Y-axis and the second wiring plate 50 is shifted to the minus side of the Y-axis minus, for example, the inability of engagement of the first connector 43 with the second connector 53 may be caused. The first wiring plate 40 according to the present embodiment having the first protrusion 42a can prevent the inability of engagement of the first connector 43 with the second connector 53, which is caused by the positional deviation during press bonding. In other words, the first wiring plate 40 facilitates the engagement of the first connector 43 with the second connector 53.

[1-3. Advantageous Effects]

As described above, the first wiring plate 40 according to the present embodiment is a flexible wiring plate connected to the display panel 20, and the first wiring plate 40 includes the first connector 43. The first connector 43 is directly connected to the second connector 53 included in the second wiring plate 50 (one example of a different wiring plate), which is connected to the display panel 20.

In such a configuration, the first wiring plate 40 can be directly connected to the second wiring plate without any additional connection wiring plate. For example, in the case where two wiring plates are connected to each other through an additional connection wiring plate, the connection wiring plate and two pairs of connectors for connecting the connection wiring plate to the two wiring plates are needed. In contrast, the first wiring plate 40 according to the present embodiment can achieve the direct connection of the first wiring plate 40 to the second wiring plate 50 only with one pair of connectors (such as the first connector 43 and the second connector 53). Accordingly, the connection wiring plate and an extra one pair of connectors are unnecessary in the connection to the second wiring plate 50. For this reason, as a result of a reduction in the number of parts, the first wiring plate 40 according to the present embodiment can reduce cost compared to that in the related art.

Furthermore, while the engagement of the connectors is performed twice in the related art, the first wiring plate 40 according to the present embodiment can enhance the workability because the connectors are engaged only once.

The first wiring plate 40 includes the first body 41 and the first arm 42 extending, in a shape of a narrow elongation, from part of the edge of the end of the first body 41. The first connector 43 is disposed in the first arm 42.

In such a configuration, the position of the first connector 43 in a plan view can be adjusted by bending the first arm 42. Accordingly, the first wiring plate 40 according to the present embodiment can prevent the inability of engagement of the first connector 43 with the second connector 53, which is caused by the positional deviation during press bonding of the first wiring plate 40 and the second wiring plate 50 to the display panel 20. Moreover, the first connector 43 disposed in the first arm 42 not press bonded to the display panel 20 (in other words, not fixed to the display panel 20) enhances the workability when the first connector 43 is engaged with the second connector 53, compared to the first connector 43 disposed in the first body 41 press bonded to the display panel 20 (in other words, one end is fixed to the display panel 20).

When the first wiring plate 40 and the second wiring plate 50 are disposed in the display panel 20, in a plan view of the first wiring plate 40, the first arm 42 overlaps with at least part of the second wiring plate 50.

In such a configuration, the first connector 43 and second connector 53 can be directly connected to each other in the position where the first arm 42 overlaps with the second wiring plate 50.

The first wiring plate 40 has an elongated shape, and the first arm 42 extends in the longitudinal direction of the first wiring plate 40.

In such a configuration, a first wiring plate 40 having a simple shape can be achieved.

As described above, the wiring plate pair 30 according to the present embodiment is composed of the first wiring plate 40 described above and the second wiring plate 50 connected to the display panel 20. The second wiring plate 50 includes the second connector 53 to be directly connected to the first connector 43 included in the first wiring plate 40.

Use of the wiring plate pair 30 including the first wiring plate 40 and the second wiring plate 50 can achieve the wiring plate pair with reduced cost. For example, compared to the case where two wiring plates are connected through an additional connection wiring plate, the wiring plate pair 30 according to the present embodiment can reduce the number of parts, and thus can reduce cost.

The second wiring plate 50 includes the second body 51, and the second arm 52 extending, in a shape of a narrow elongation, from the edge of the end of the second body 51. The second connector 53 is disposed in the second arm 52.

In such a configuration, the position of the first connector 43 and the second connector 53 in a plan view can be adjusted by bending the first arm 42 and the second arm 52. Accordingly, the inability of engagement of the first connector 43 with the second connector 53, which is caused by the positional deviation when the first wiring plate 40 and the second wiring plate 50 are press bonded to the display panel 20, can be further prevented. The workability when the first connector 43 is engaged with the second connector 53 is further improved.

As described above, the display device 100 according to the present embodiment includes the display panel 20 and the above-mentioned wiring plate pair 30.

Such a configuration can result in a display device 100 including a wiring plate pair 30 with reduced cost. In other words, a display device 100 can be achieved with reduced cost.

Embodiment 2

[2-1. Configuration of Display Module]

The configuration of a display module according to the present embodiment will be described with reference to FIG. 5. In the present embodiment, differences from Embodiment 1 will be mainly described.

Figure 5:
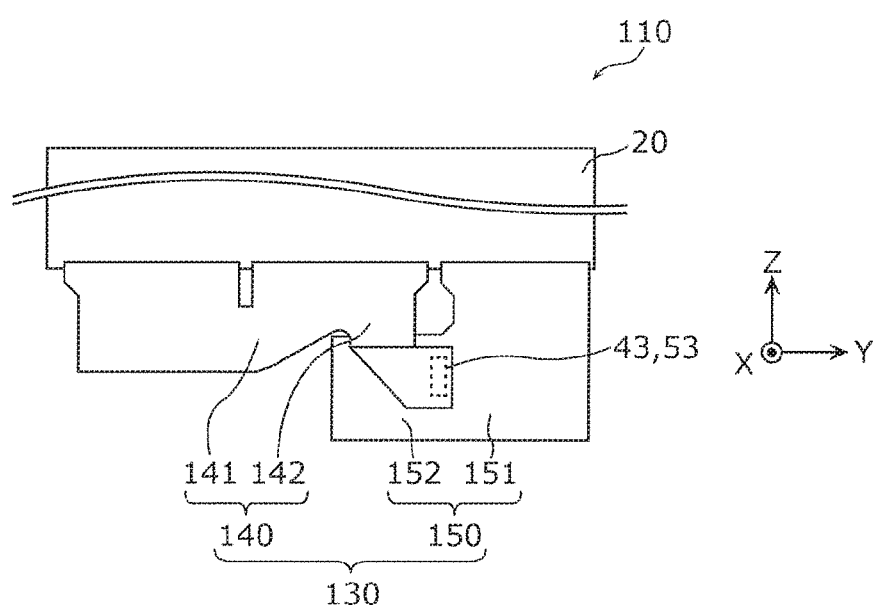
FIG. 5 is a schematic view illustrating a configuration of a display module according to Embodiment 2.

FIG. 5 is a schematic view illustrating the configuration of a display module 110 according to the present embodiment.

As illustrated in FIG. 5, the wiring plate pair 130 according to the present embodiment includes a first wiring plate 140 and a second wiring plate 150.

The first wiring plate 140 includes a first body 141, and a first arm 142 projected from part of the edge of one end of the first body 141. The first arm 142 includes a first connector 43 to be directly connected to a second connector 53 included in the second wiring plate 150.

In a plan view, the first arm 142 is projected from the edge of one end of the first body 141 inclined to the longitudinal direction of the display panel 20 among the edges of the ends of the first body 141. More specifically, in a plan view, the first arm 142 extends, in a shape of a narrow elongation, in the direction opposite to the display panel 20 from the edge of the end of the first body 141 inclined to the longitudinal direction of the display panel 20. In other words, the first arm 142 extends, in a shape of a narrow elongation, toward the second arm 152. In short, the first arm 142 has a width (length in the Y-axis direction) smaller than the width (the length in the Y-axis direction) and length of the first body 141.

The second wiring plate 150 includes a second body 151, and a second arm 152 projected from part of the edge of one end of the second body 151. The second arm 152 includes a second connector 53 to be directly connected to the first connector 43 included in the first wiring plate 140.

In a plan view, the second arm 152 is formed to be projected from the edge of one end substantially orthogonal to the longitudinal direction of the display panel 20 among the edges of the ends of the second body 151. More specifically, in a plan view, the second arm 152 extends, in a shape of a narrow elongation, from the edge of the end substantially orthogonal to the longitudinal direction of the display panel 20 toward the first arm 142. The second arm 152 has a width (length in the Y-axis direction) and a length (length in the Z-axis direction) smaller than the width (the length in the Y-axis direction) and length (the length in the Z-axis direction) of the second body 151.

Unlike Embodiment 1, in the wiring plate pair 130 according to the present embodiment, the first connector 43 is engaged with the second connector 53 by folding the first arm 142.

[2-2. Process of Manufacturing Display Device]

The process of manufacturing the display device according to the present embodiment will now be described with reference to FIGS. 6A to 6C. The flowchart illustrating the process of manufacturing the display module 110 is similar to that of Embodiment 1, and the description thereof will be omitted. In the present embodiment, the connection of the first connector 43 to the second connector 53 (S20 in FIG. 3) will be mainly described.

Figure 6A:
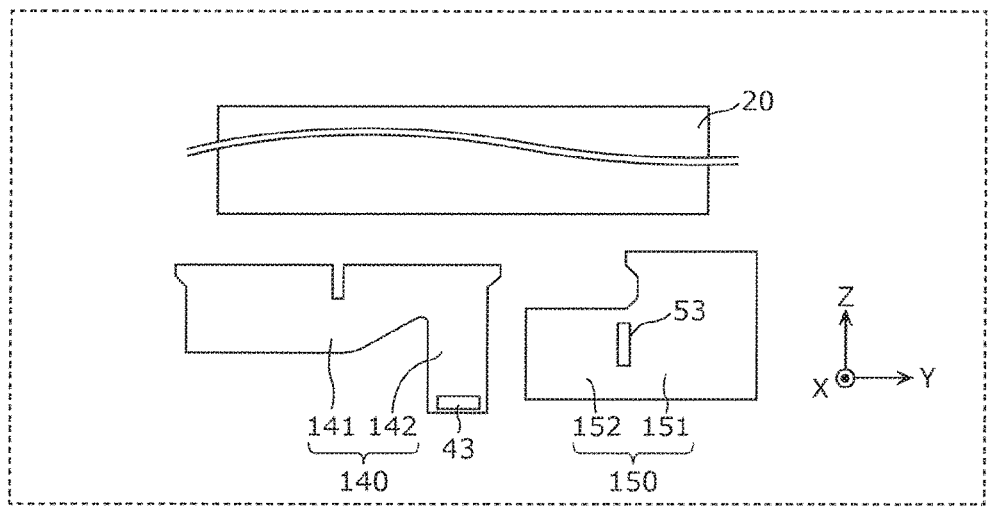
FIG. 6A is a schematic view illustrating a state before wiring plates according to Embodiment 2 are press bonded to a display panel.
Figure 6B:
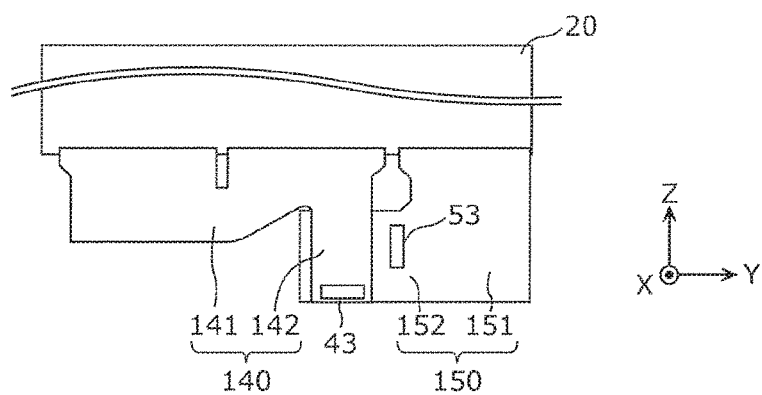
FIG. 6B is a diagram illustrating a state after the wiring plates according to Embodiment 2 are press bonded to the display panel.
Figure 6C:
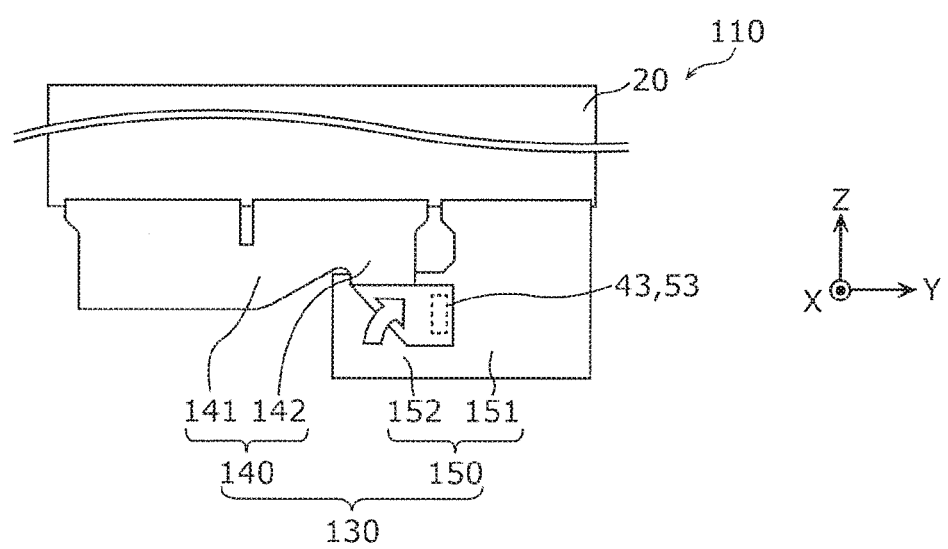
FIG. 6C is a schematic view illustrating a state where the wiring plates according to Embodiment 2 are connected to each other.

FIGS. 6A to 6C are schematic views illustrating a flow of manufacturing the display module 110 according to the present embodiment.

FIG. 6A is a schematic view illustrating a state before the first wiring plate 140 and the second wiring plate 150 according to the present embodiment are press bonded to the display panel 20.

As illustrated in FIG. 6A, the first wiring plate 140 having the first connector 43 mounted on the surface of the first arm 142 on the plus side of the X-axis and the second wiring plate 150 having the second connector 53 mounted on the surface of the second arm 152 on the plus side of the X-axis are prepared, and are aligned with the display panel 20 on the minus side of the Z-axis. The first connector 43 is disposed on the distal end of the first arm 142 (the end on the minus side of the Z-axis). The second connector 53 is disposed in the second arm 152 closer to the second body 151.

FIG. 6B is a schematic view illustrating a state after the first wiring plate 140 and the second wiring plate 150 according to the present embodiment are press bonded to the display panel 20.

As illustrated in FIG. 6B, in a plan view, the first arm 142 overlaps with at least part of the second arm 152 in the state where the display panel 20 is press bonded to the first wiring plate 140 and the second wiring plate 150. In the present embodiment, the first arm 142 is formed such that the edge of the distal end of the first arm 142 substantially matches with the edge of the one end opposite to the display panel 20 among the edges of the ends of the second arm 152. Such a configuration can prevent the first arm 142 from having an unnecessary excess length. The first arm 142 can have any length.

The surface of the first arm 142 on which the first connector 43 is disposed faces an identical direction with the surface of the second wiring plate 150 on which the second connector 53 is disposed. In the present embodiment, the first connector 43 and the second connector 53 are disposed on the surfaces of the first arm 142 and the second arm 152 on the plus side of the X-axis.

The first connector 43 and the second connector 53 have elongated shapes in a plan view. When the first wiring plate 140 and the second wiring plate 150 are connected to the display panel 20, the longitudinal direction (the Y-axis direction) of the first connector 43 is substantially orthogonal to the longitudinal direction (the X-axis direction) of the second connector 53.

When the first wiring plate 140 and the second wiring plate 150 are connected to the display panel 20, in a plan view, the first arm 142 does not overlap with the second body 151 and the second arm 152 does not overlap with the first body 141.

FIG. 6C is a schematic view illustrating a state after the first wiring plate 140 and the second wiring plate 150 according to the present embodiment are directly connected to each other.

As illustrated in FIG. 6C, the first connector 43 is directly connected to the second connector 53 by folding the first arm 142 (see the arrow in the drawing). In other words, the first wiring plate 140 is connected to the second wiring plate 150 without any additional connection wiring plate. For example, the first arm 142 is folded under a pressure allowing folding. For example, the first arm 142 is folded such that the folded portion and the unfolded portion of the first arm 142 form an acute angle. The folding of the first arm 142 under pressure or with an acute angle can prevent the application of the stress caused by folding of the first arm 142 to the interface (connection) between the first body 141 and the first arm 142.

The first arm 142 has a redundancy such that the first connector 43 is engaged with the second connector 53 by the folding. The length of the first arm 142 (the length in the Z-axis direction) is determined according to the positions where the first connector 43 and the second connector 53 are disposed. For example, when the second connector 53 is disposed in the second body 151 without the second arm 152, the first arm 142 may be formed to a position beyond the edge of the end of the second body 151 opposite to the display panel 20.

When there occurs a positional deviation during press bonding of the first wiring plate 140 or the second wiring plate 150 to the display panel 20, the position of the first connector 43 in a plan view can be adjusted through the adjustment of the folding position or angle of the first arm 142. For example, even when at least one of the first wiring plate 140 and the second wiring plate 150 is press bonded to the display panel 20 with a rotational shift in a plan view, the first wiring plate 140 according to the present embodiment can prevent the inability of engagement of the first connector 43 with the second connector 53 caused by this rotational shift. The term "rotational shift" indicates that in a plan view, the display panel 20 is press bonded in a position rotated clockwise or counterclockwise from the original position. The rotational shift here indicates a shift to an extent negatively affecting the electrical and mechanical connection of the first wiring plate 140 and the second wiring plate 150 to the display panel 20, for example, a rotational shift to an extent causing no problem such as short-circuiting.

[2-3. Advantageous Effects]

As described above, when the first wiring plate 140 according to the present embodiment (one example of the wiring plate) and the second wiring plate 150 (another example of the wiring plate) are disposed in the display panel 20, the first connector 43 in the first wiring plate 140 is disposed in a position not overlapping with the second connector 53 in a plan view of the first wiring plate 140.

In such a configuration, the first connector 43 can be engaged with the second connector 53 by bending or folding the first arm 142. The engagement of the first connector 43 with the second connector 53 is further facilitated, compared to the first arm 42 according to Embodiment 1 through the adjustment of the bending position, the folding position and angle of the first arm 142.

The surface of the first arm 142 on which the first connector 43 is disposed faces an identical direction with the surface of the second wiring plate 150 on which the second connector 53 is disposed, when the first wiring plate 140 and the second wiring plate 150 are disposed in the display panel 20.

In such a configuration, the first connector 43 can be engaged with the second connector 53 by folding the first arm 142. The engagement of the first connector 43 with the second connector 53 is further facilitated, compared to the first arm 42 according to Embodiment 1 through the adjustment of the folding position and angle of the first arm 142.

When the first connector 43 and the second connector 53 have elongated shapes in a plan view and the first wiring plate 140 and the second wiring plate 150 are disposed in the display panel 20, the longitudinal direction of the first connector 43 is substantially orthogonal to the longitudinal direction of the second connector 53.

In such a configuration, the first connector 43 can be engaged with the second connector 53 by folding the first arm 142 at about 45° to the longitudinal direction of the second connector 53, which is intuitively easy to understand.

As described above, the first wiring plate 140 included in the wiring plate pair 130 according to the present embodiment includes the first body 141, and the first arm 142 extending, in a shape of a narrow elongation, from part of the edge of the one end of the first body 141, and is directly connected to the second wiring plate 150 by folding the first arm 142.

In such a configuration, the first connector 43 can be engaged with the second connector 53 by folding the first arm 142. The engagement of the first connector 43 with the second connector 53 is further facilitated, compared to the wiring plate 30 according to Embodiment 1 through the adjustment of the folding position and angle of the first arm 142.

Embodiment 3

[3-1. Configuration of First Wiring Plate and Second Wiring Plate]

A configuration of a first wiring plate 240 and a second wiring plate 250 according to the present embodiment will be described with reference to FIGS. 7 to 11. Specifically, in the present embodiment, the directions of the connectors mounted on the first wiring plate 240 and the second wiring plate 250 will be described. In the present embodiment, a case where the extending direction of an arm (such as a first arm 242) is substantially orthogonal to the longitudinal direction of the connector (such as a first connector 43) will be described as the first wiring plate 240, and a case where the extending direction of an arm (such as a second arm 252) is substantially parallel to the longitudinal direction of a connector (such as a second connector 53) will be described as the second wiring plate 250.

The direction of the first connector 43 mounted on the first wiring plate 240 will now be described with reference to FIGS. 7 and 8.

Figure 7:
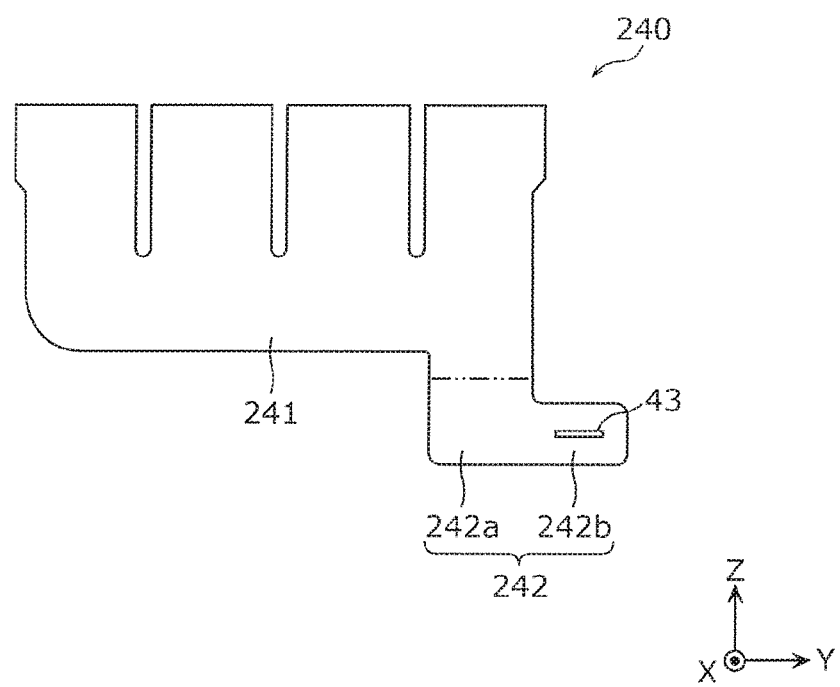
FIG. 7 is a schematic view illustrating a configuration of a first wiring plate according to Embodiment 3.

FIG. 7 is a schematic view illustrating a configuration of the first wiring plate 240 according to the present embodiment.

As illustrated in FIG. 7, the first wiring plate 240 includes a first body 241, and a first arm 242 projected from part of the edge of one end of the first body 241. The first body 241 includes a connection terminal (not illustrated) for connecting to a display panel 20, the connection terminal being disposed at the end of the first body 241 on the plus side of the Z-axis. The first arm 242 includes a first protrusion 242a extending, in a shape of a narrow elongation, from the edge of one end of the first body 241 in the direction opposite to the display panel 20 (the direction from the plus side of the Z-axis toward the minus side of the Z-axis), and a second protrusion 242b extending, in a shape of a narrow elongation, from the edge of one end of the first protrusion 242a in the direction different from the extending direction of the first protrusion 242a (the direction from the minus side of the Y-axis toward the plus side of the Y-axis). For example, the second protrusion 242b extends, in a shape of a narrow elongation, from the edge of the one end of the first protrusion 242a in the direction toward a different wiring plate (such as the second wiring plate 250) directly connected to the first wiring plate 240. The first arm 242 has a width (the length in the Y-axis direction) and a length (the length in the Z-axis direction) smaller than the width (the length in the Y-axis direction) and length (the length in the Z-axis direction) of the first body 241.

The direction from the plus side of the Z-axis toward the minus side of the Z-axis is one example of the first direction, and the direction from the minus side of the Y-axis toward the plus side of the Y-axis is one example of the second direction. For example, the first direction intersects substantially perpendicular to the second direction. In other words, the first arm 242 has an L-shape. The first protrusion 242a can have any length in the first direction (the Z-axis direction), and the second protrusion 242b can have any length in the second direction (the Y-axis direction). The first direction and the second direction can have any positional relation other than the positional relation intersecting substantially perpendicular to each other.

The first connector 43 is mounted on the second protrusion 242b. In a plan view, the first connector 43 has an elongated shape. The first connector 43 is mounted on the second protrusion 242b such that the longitudinal direction (Y-axis direction) of the first connector 43 is substantially parallel to the extending direction of the second protrusion 242b. The first connector 43 may be mounted on the second protrusion 242b, or may be disposed from the second protrusion 242b to part of the first protrusion 242a.

For example, by folding the first protrusion 242a, the first connector 43 is engaged with a connector (such as the second connector 53) mounted on the different wiring plate (such as the second wiring plate 250) to be connected to the display panel 20. The position of the first connector 43 in a plan view after the folding can be adjusted through the adjustment of the folding position and angle of the first protrusion 242a.

The shape of the first arm 242 according to the direction of the first connector 43 mounted will now be described with reference to FIG. 8.

Figure 8:
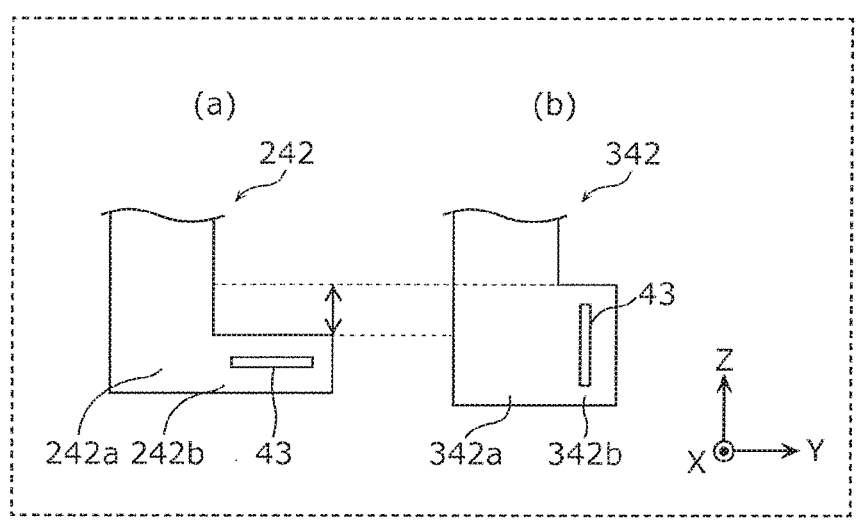
FIG. 8 is a diagram illustrating examples of the shape of a first arm according to Embodiment 3 according to the direction of a first connector.

FIG. 8 is a diagram illustrating the shape of the first arm 242 according to the direction of the first connector 43. Specifically, (a) of FIG. 8 illustrates the shape of the first arm 242 according to the present embodiment. In other words, (a) of FIG. 8 illustrates the shape of the first arm 242 in a plan view in the case where the extending direction of the second protrusion 242b is substantially parallel to the longitudinal direction of the first connector 43 (hereinafter, also simply referred to as "substantially parallel case").

(b) of FIG. 8 illustrates the shape of the first arm 342 in a plan view in the case where the extending direction of the second protrusion 342b is substantially orthogonal to the longitudinal direction of the first connector 43 (hereinafter, also simply referred to as "substantially orthogonal case").

As illustrated in (a) and (b) of FIG. 8, the second protrusion 242b has a length (length in the Z-axis direction) smaller than the length of the second protrusion 342b (the length in the Z-axis direction) (see the double-headed arrow in the drawing). For example, the length of the second protrusion 242b is smaller than the length of the second protrusion 342b by the length according to the difference between the length of the first connector 43 in the longitudinal direction and the length thereof in the lateral direction. In other words, the first arm 242 has an increased folding region of the first protrusion 242a. Specifically, the folding length of the first protrusion 242a is larger than the folding length of the first protrusion 342a by the length indicated by the double-headed arrow in the drawing. Such a configuration provides an increased region for adjusting the position of the first connector 43 in a plan view after folding the first protrusion 242a in the substantially parallel case, compared to the substantially orthogonal case. In other words, to prevent the inability of engagement of the first connector 43 with a connector mounted on a different wiring plate, the first connector 43 can be mounted so as to be substantially parallel to the extending direction of the second protrusion 242$b$ in (a) of FIG. 8 or the second protrusion 342$b$ in (b) of FIG. 8. Compared to the substantially orthogonal case, the engagement of the first connector 43 with a connector mounted on a different wiring plate is facilitated in the substantially parallel case.

The direction of the second connector 53 mounted on the second wiring plate 250 will now be described with reference to FIGS. 9 and 10.

Figure 9:
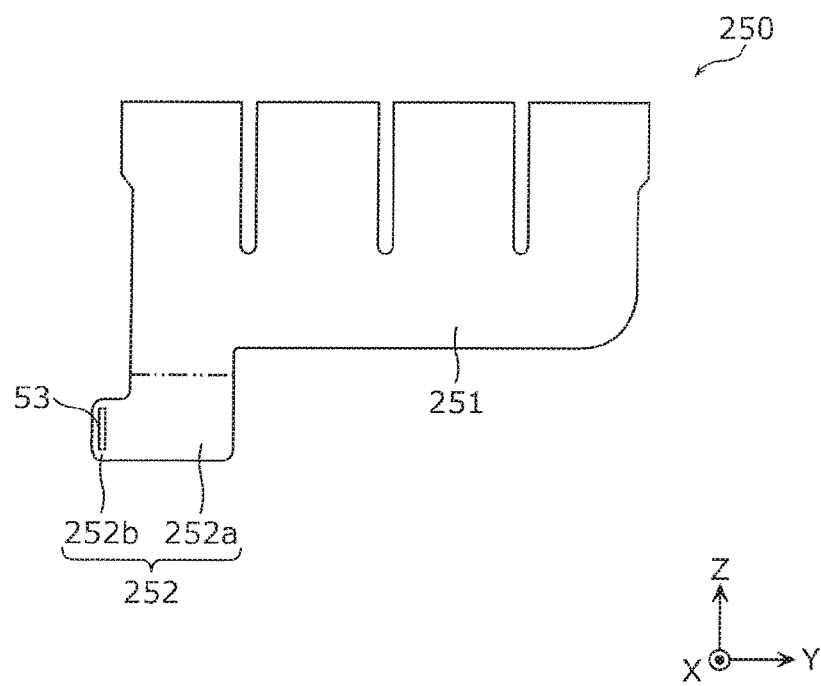
FIG. 9 is a schematic view illustrating a configuration of a second wiring plate according to Embodiment 3.

FIG. 9 is a schematic view illustrating a configuration of the second wiring plate 250 according to the present embodiment.

As illustrated in FIG. 9, the second wiring plate 250 includes a second body 251, and a second arm 252 projected from part of the edge of one end of the second body 251. The second body 251 includes a connection terminal (not illustrated) for connecting to the display panel 20, the connection terminal being disposed at the end of the second body 251 on the plus side of the Z-axis. The second arm 252 includes a first protrusion 252$a$ extending, in a shape of a narrow elongation, from the edge of one end of the second body 251 in the direction opposite to the display panel 20 (the direction from the plus side of the Z-axis toward the minus side of the Z-axis, which is one example of the first direction), and a second protrusion 252$b$ extending, in a shape of a narrow elongation, from the edge of one end of the first protrusion 252$a$ in the direction different from the extending direction of the first protrusion 252$a$ (the direction from the minus side of the Y-axis toward the plus side of the Y-axis, which is one example of the second direction). For example, the second protrusion 252$b$ extends, in a shape of a narrow elongation, from the edge of one end of the first protrusion 252$a$ toward the direction of the different wiring plate (such as the first wiring plate 240) to be directly connected to the second wiring plate 250. The second arm 252 has a width (the length in the Y-axis direction) and a length (length in the Z-axis direction) smaller than the width (the length in the Y-axis direction) and length (the length in the Z-axis direction) of the second body 251.

For example, in the second arm 252 having an L-shape, the first protrusion 252$a$ can have any length in the first direction (the Z-axis direction), and the second protrusion 252$b$ can have any length in the second direction (the Y-axis direction). The first direction and the second direction can have any positional relation other than the positional relation intersecting substantially perpendicular to each other.

The second connector 53 is mounted on the second protrusion 252$b$. In a plan view, the second connector 53 has an elongated shape. The second connector 53 is mounted on the second protrusion 252$b$ such that the longitudinal direction (the Y-axis direction) of the second connector 53 is substantially orthogonal to the extending direction of the second protrusion 252$b$. The second connector 53 may be mounted on the second protrusion 252$b$, or may be disposed from the second protrusion 252$b$ to part of the first protrusion 252$a$.

For example, by folding the first protrusion 252$a$, the second connector 53 is engaged with a connector (such as the first connector 43) mounted on a different wiring plate (such as the first wiring plate 240) to be connected to the display panel 20. The position of the second connector 53 in a plan view after the folding can be adjusted through the adjustment of the folding position and angle of the first protrusion 252$a$.

The shape of the second arm 252 according to the direction of the second connector 53 mounted will now be described with reference to FIG. 10.

Figure 10:
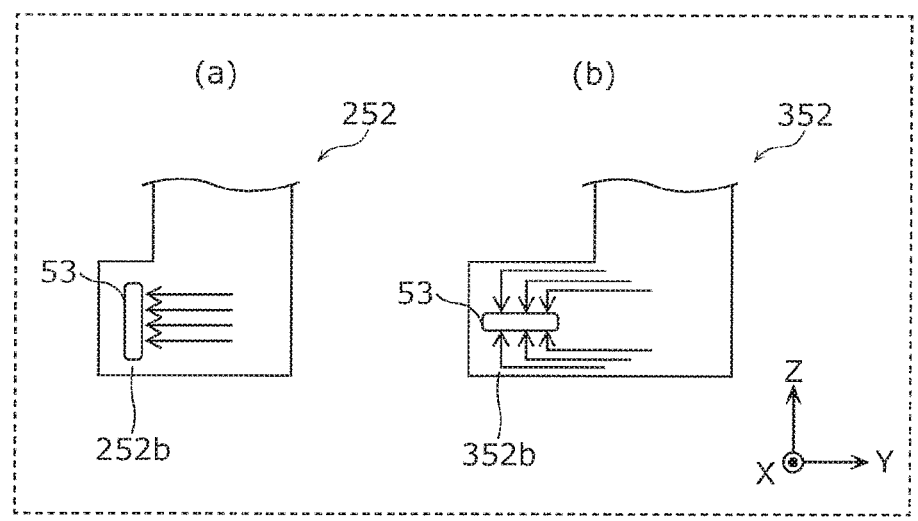
FIG. 10 is a schematic view illustrating wiring patterns according to the direction of a second connector.

FIG. 10 is a diagram illustrating the shape of the second arm 252 according to the direction of the second connector 53. Specifically, (a) of FIG. 10 illustrates the shape of the second arm 252 according to the present embodiment. In other words, (a) of FIG. 10 illustrates the shape of the second arm 252 in a plan view in the case where the extending direction (the Y-axis direction) of the second protrusion 252$b$ is substantially orthogonal to the longitudinal direction (the Z-axis direction) of the second connector 53 (hereinafter, also simply referred to as "substantially orthogonal case"). (b) of FIG. 10 illustrates the shape of the second arm 352 in a plan view in the case where the extending direction (the Y-axis direction) of the second protrusion 352$b$ is substantially parallel to the longitudinal direction (the Y-axis direction) of the second connector 53 (hereinafter, also simply referred to as "substantially parallel case"). In the drawing, the arrows with the solid line indicate the wiring patterns in the second arms 252 and 352 formed around the region where the second connector 53 is disposed.

As illustrated in (a) and (b) of FIG. 10, the shape of the wiring pattern varies according to the direction of the second connector 53 mounted. Specifically, as illustrated in (a) of FIG. 10, the wiring pattern is formed with linear wirings in the substantially orthogonal case. In other words, the design of the wiring is facilitated around the position of the second arm 252 on which the second connector 53 is mounted. The wiring pattern may be formed such that wirings are disposed in a hairpin shape extending from the rear surface of the second arm 252 (the surface on the minus side of the X-axis) to the front surface (the surface on the plus side of the Z-axis on which the second connector 53 is mounted).

As illustrated in (b) of FIG. 10, the wiring pattern is formed with bent wirings in the substantially parallel case. In other words, the design of the wiring is more difficult than in the substantially orthogonal case because the wiring density increases in the region around the position of the second arm 252 on which the second connector 53 is mounted. For easiness in design of the wiring pattern in and around the region on which the second connector 53 is mounted, the second connector 53 is mounted so as to be substantially orthogonal to the extending direction of the second protrusion 252$b$ in (a) of FIG. 10 or the second protrusion 352$b$ in (b) of FIG. 10.

Furthermore, a case where the second wiring plate 250 is curved toward the thickness direction (the X-axis direction) of the second wiring plate 250 will be described with reference to FIG. 11.

Figure 11:
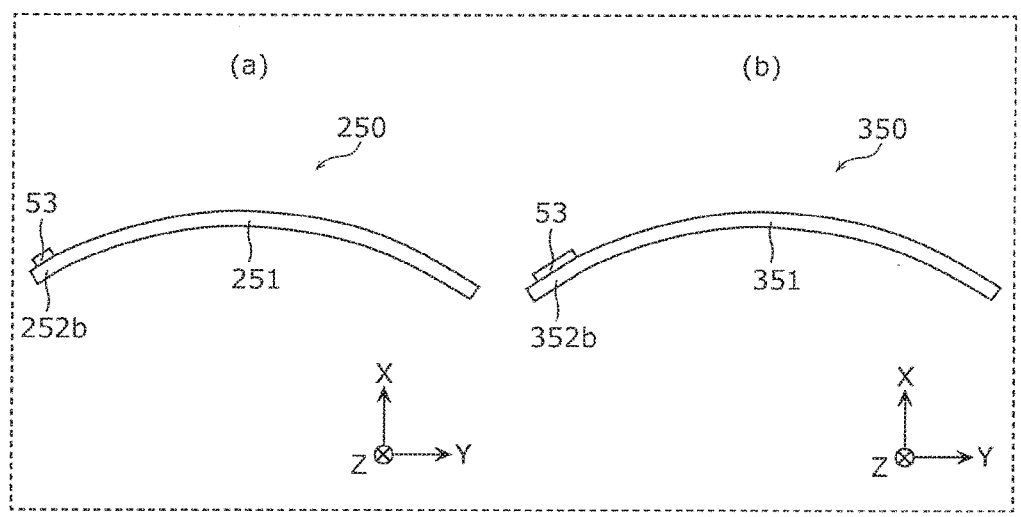
FIG. 11 is a schematic view illustrating states where the second wiring plate according to Embodiment 3 is curved.

FIG. 11 is a schematic view illustrating a state where the second wiring plate 250 according to the present embodiment is curved. Specifically, (a) of FIG. 11 illustrates a second wiring plate 250 curved toward the thickness direction in the substantially orthogonal case, and (b) of FIG. 11 illustrates a second wiring plate 350 curved toward the thickness direction in the substantially parallel case. (a) and (b) of FIG. 11 illustrate the curved second arm 252, viewed in the direction from the second wiring plate 250 toward the display panel 20 (the direction from the minus side of the Z-axis toward the plus side of the Z-axis) in a plan view. A view in the direction from the second wiring plate 250 toward the display panel 20 is also referred to as "in a lateral view".

As illustrated in (a) and (b) of FIG. 11, in the case where the second wiring plate is curved toward the thickness direction, the second connector 53 itself is not curved. For this reason, in a lateral view, the second wiring plate has no curve in the portion of the second protrusion on which the second connector 53 is mounted.

As illustrated in (a) of FIG. 11, in the substantially orthogonal case, in a lateral view, the second connector 53 contacts the second protrusion 252b by the lateral length of the second connector 53. In contrast, as illustrated in (b) of FIG. 11, in a lateral view, the second connector 53 contacts the second protrusion 252b by the longitudinal length of the second connector 53 in the substantially parallel case. In other words, a larger curved region of the second wiring plate in a lateral view can be achieved in the substantially orthogonal case than in the substantially parallel case. Namely, the second body 251 is more prone to curve in the substantially orthogonal case than in the substantially parallel case. In other words, the curve of the second body 251 is barely affected by the second connector 53. For this reason, for example, in the case where the display panel 20 has flexibility and is curved, to facilitate the achievement of the curve of the second body 251, the second connector 53 is mounted such that the longitudinal direction thereof is substantially orthogonal to the extending direction of the second protrusion 252b.

[3-2. Advantageous Effects]

As described above, the second arm 252 according to the present embodiment (one example of the first arm) includes the first protrusion 252a extending in the first direction, and the second protrusion 252b extending from part of the edge of one end of the first protrusion 252a in the second direction different from the first direction. The second connector 53 (one example of the first connector) has an elongated shape, and is disposed in the second protrusion 252b such that the longitudinal direction of the second connector 53 is substantially orthogonal to the second direction.

In such a configuration, the curve of the second body 251 is barely affected by the second connector 53 mounted on the second arm 252. In other words, the second body 251 is more prone to curve than in the substantially parallel case. Furthermore, such a configuration facilitates the design of the wiring around the region on which the second connector 53 is mounted.

The first arm 242 includes the first protrusion 242a extending in the first direction, and the second protrusion 242b extending from the first protrusion 242a in the second direction different from the first direction. The first connector 43 has an elongated shape, and is disposed in the second protrusion 242b such that the longitudinal direction of the first connector 43 is substantially parallel to the second direction.

In such a configuration, the first arm 242 has a larger folding region of the first protrusion 242a, compared to the substantially orthogonal case. In other words, the configuration in the substantially parallel case has a wider region for adjusting the position of the first connector 43 in a plan view after folding of the first protrusion 242a than that in the substantially orthogonal case. Accordingly, such a configuration can prevent the inability of engagement of the first connector 43 with the second connector 53 caused by the rotational shift during press bonding.

The first connector 43 mounted over the first protrusion 242a and the second protrusion 242b achieves the same advantageous effects as those in the case where the first connector 43 is mounted only on the second protrusion 242b.

Other Embodiments

The flexible wiring plate, the flexible wiring plate pair, and the display device according to the present disclosure have been described, but the embodiments described above should not be construed as limitations to the flexible wiring plate pair, and the display device according to the present disclosure. Other embodiments implemented with combinations of any components in these embodiments, modifications obtained through a variety of alterations of the embodiments made by persons skilled in the art without departing the gist of the present disclosure, and a variety of apparatuses and devices including the flexible wiring plate, the flexible wiring plate pair, and the display device according to the present embodiments are also included in the present disclosure.

In the embodiments, the connector indicates a member which can directly connect the first wiring plate to the second wiring plate. For example, the first wiring plate may be press bonded to the second wiring plate with a conductive adhesive such as an anisotropic conductive film (ACF), or may be connected to the second wiring plate with solder. In this case, the ACF or solder are also included in the connector in this specification.

Although the case where both the first wiring plate and the second wiring plate have arms has been described in the embodiments above, any other configuration may be used. A single arm may be disposed in at least one of the first wiring plate and the second wiring plate.

Although the wiring plate pair has been described in the embodiments above as the state where the first wiring plate is connected to the second wiring plate, the wiring plate pair can have any other state. The state where the first wiring plate is not connected to the second wiring plate is also included in the wiring plate pair in the specification. In other words, two wiring plates which can be connected to each other are also included in the wiring plate pair in the specification.

Any wiring pattern can be formed on the arms (the first arm and the second arm) according to the embodiments above. For example, the wiring pattern may be a solid pattern formed with a plurality of wirings. Among signal lines and power supply lines, the wirings having large widths (the lengths of the wirings in the lateral direction), such as power supply lines, may be formed into a mesh pattern. The flexibility of the arm can be more significantly maintained in the mesh pattern of wirings than in the solid pattern of wirings, facilitating the bending or folding of the arm. In other words, the arm having a mesh pattern of wirings improves the workability during the bending or folding of the arm.

Although the example in which the first wiring plate and the second wiring plate are flexible substrates in the embodiments above has been described, any other substrates can be used. For example, at least one of the first wiring plate and the second wiring plate may be a rigid-flexible substrate, which is an integrated substrate of a rigid substrate and a flexible substrate. In this case, the connector for directly connecting to a different wiring plate may be mounted on the rigid substrate or may be mounted on the flexible substrate.

Although the example in which an electronic component is mounted on the first wiring plate and the second wiring plate in the embodiments above has been described, any other configuration can be used. For example, the electronic component may be mounted on only one of the first wiring plate and the second wiring plate, and the electronic component may be mounted on neither the first wiring plate nor the second wiring plate.

Although the example in which only the connectors (the first connector and the second connector) are mounted on the first arm and the second arm in the embodiments above has been described, any other configuration can be used. For example, an electronic component other than the connector may be mounted on at least one of the first arm and the second arm.

Although the example in which the first wiring plate and the second wiring plate are disposed to be aligned at the same end of the display panel in the embodiments above has been described, any other configuration can be used. The first wiring plate and the second wiring plate may be disposed at different ends of the display panel. For example, the first wiring plate may be disposed at the end of the display panel on the minus side of the Z-axis, and the second wiring plate may be disposed at the end of the display panel on the plus side of the Y-axis. In this case, the direct connection of the first wiring plate to the second wiring plate can also be established because the first wiring plate and the second wiring plate each have the arm (such as the first arm or the second arm) extending in the longitudinal direction.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to display devices including flexible wiring plates connected to display panels, and is particularly useful in display devices having large display panels.

The invention claimed is:

1. A flexible wiring plate pair comprising:
a flexible wiring plate to be connected to a display panel; and
a different flexible wiring plate to be connected to the display panel,
wherein the flexible wiring plate includes a first connector, and
the first connector is directly connected to a second connector included in the different flexible wiring plate, and
wherein the different flexible wiring plate includes a second body, and a second arm extending, in a shape of a narrow elongation, from part of an edge of one end of the second body, and
the second connector is disposed in the second arm.
2. The flexible wiring plate pair according to claim 1,
wherein the flexible wiring plate includes a first body, and a first arm extending, in a shape of a narrow elongation, from part of an edge of one end of the first body, and
the first connector is disposed in the first arm.
3. The flexible wiring plate pair according to claim 2,
wherein the first arm overlaps with at least part of the different flexible wiring plate in a plan view of the flexible wiring plate when the flexible wiring plate and the different flexible wiring plate are disposed in the display panel.
4. The flexible wiring plate pair according to claim 2,
wherein the first connector is disposed in a position not overlapping with the second connector in the plan view of the flexible wiring plate when the flexible wiring plate and the different flexible wiring plate are disposed in the display panel.
5. The flexible wiring plate pair according to claim 2,
wherein a surface of the first arm on which the first connector is disposed faces an identical direction with a surface of the different flexible wiring plate on which the second connector is disposed, when the flexible wiring plate and the different flexible wiring plate are disposed in the display panel.
6. The flexible wiring plate pair according to claim 2,
wherein in the case where the first connector has an elongated shape and the second connector has an elongated shape,
a longitudinal direction of the first connector is substantially orthogonal to a longitudinal direction of the second connector when the flexible wiring plate and the different flexible wiring plate are disposed in the display panel.
7. The flexible wiring plate pair according to claim 2,
wherein the first arm includes a first protrusion extending in a first direction, and a second protrusion extending from the first protrusion in a second direction different from the first direction,
the first connector has an elongated shape, and
the first connector is disposed in the second protrusion such that a longitudinal direction of the first connector is substantially orthogonal to the second direction.
8. The flexible wiring plate pair according to claim 2,
wherein the first arm includes a first protrusion extending in a first direction, and a second protrusion extending from the first protrusion in a second direction different from the first direction,
the first connector has an elongated shape, and
the first connector is disposed in the second protrusion such that a longitudinal direction of the first connector is substantially parallel to the second direction.
9. The flexible wiring plate pair according to claim 2,
wherein the flexible wiring plate has an elongated shape, and
the first arm extends in a longitudinal direction of the flexible wiring plate.
10. A display device, comprising:
the display panel; and
the flexible wiring plate pair according to claim 1.
11. A flexible wiring plate pair comprising:
a flexible wiring plate to be connected to a display panel; and
a different flexible wiring plate to be connected to the display panel,
wherein the flexible wiring plate includes a first connector, and
the first connector is directly connected to a second connector included in the different flexible wiring plate, and
wherein the flexible wiring plate includes a first body, and a first arm extending, in a shape of a narrow elongation, from part of an edge of one end of the first body, and
the flexible wiring plate is directly connected to the different flexible wiring plate by folding the first arm, and
wherein the different flexible wiring plate includes a second body, and a second arm extending, in a shape of a narrow elongation, from part of an edge of one end of the second body, and
the second connector is disposed in the second arm.
12. A display device, comprising:
the display panel; and
the flexible wiring plate pair according to claim 11.

* * * * *